United States Patent [19]

Lind et al.

[11] 4,371,599

[45] Feb. 1, 1983

[54] PROCESS FOR THE PREPARATION OF PRINTING FORMS AND/OR METALLIZED IMAGES

[75] Inventors: Erwin Lind, Auringen; Ilse Bader, Wiesbaden, both of Fed. Rep. of Germany

[73] Assignee: Hoechst Aktiengesellschaft, Fed. Rep. of Germany

[21] Appl. No.: 750,434

[22] Filed: Dec. 14, 1976

[30] Foreign Application Priority Data

Dec. 15, 1975 [DE] Fed. Rep. of Germany ....... 2556386

[51] Int. Cl.$^3$ .................. G03F 7/10; G03G 13/32
[52] U.S. Cl. ...................... 430/49; 430/306; 430/309
[58] Field of Search ............. 96/33, 1 R, 1.4, 36.3; 430/49, 306, 309

[56] References Cited

U.S. PATENT DOCUMENTS

| | | | |
|---|---|---|---|
| 2,681,473 | 6/1954 | Carlson | 252/62.1 P |
| 2,949,848 | 8/1960 | Mott | 96/1 |
| 3,088,402 | 5/1963 | Newman | 96/1 R |
| 3,305,359 | 2/1967 | Delmont | 430/49 |
| 3,446,616 | 5/1969 | Clark | 96/28 |
| 3,615,385 | 10/1971 | Lind | 96/1 |
| 3,650,797 | 3/1972 | Tomanek | 252/62.1 P |
| 3,664,834 | 5/1972 | Amidon et al. | 96/1.4 |
| 3,676,350 | 7/1972 | Wright et al. | 252/62.1 P |
| 3,682,677 | 8/1972 | Gundlach et al. | 96/1.4 |
| 3,761,413 | 9/1973 | Hulse | 430/109 |
| 3,970,453 | 7/1976 | Belli | 96/1.4 |
| 4,024,242 | 5/1977 | Lu et al. | 430/114 |

*Primary Examiner*—John E. Kittle
*Assistant Examiner*—John L. Goodrow
*Attorney, Agent, or Firm*—James E. Bryan

[57] ABSTRACT

This invention relates to an improvement in the process for the preparation of printing forms and/or metallized images by electrostatic charging, exposing, and treating with a toner of a photoconductor layer applied to an electrically conductive support material, and removing the photoconductor layer in the non-image areas, the improvement which comprises effecting removal of the toner-free photoconductor layer by transferring it at a temperature in the range of about 50° to 250° C. to a receiving material which has a greater surface adhesion to the photoconductor layer than does the electrically conductive support material.

6 Claims, 3 Drawing Figures

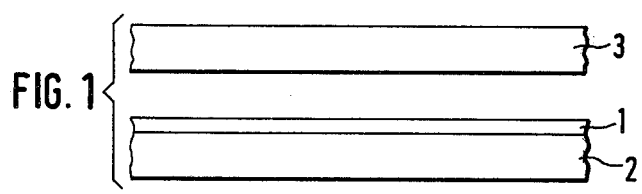
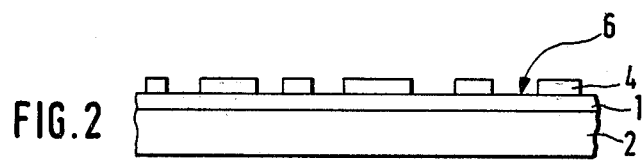
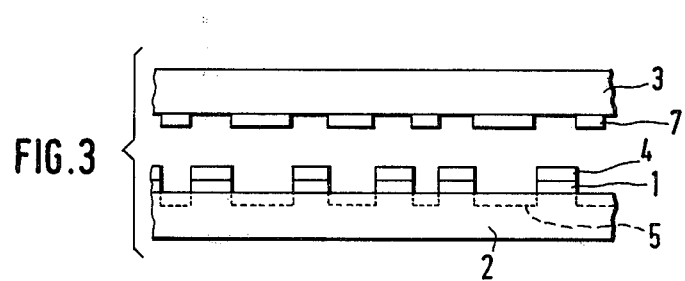

PROCESS FOR THE PREPARATION OF PRINTING FORMS AND/OR METALLIZED IMAGES

The invention relates to a process for the preparation of printing forms and/or metallized images by electrophotographic means, i.e. by electrostatic charging, exposing and treating with a toner of a photoconductor layer applied to an electrically conductive support material, removing the photoconductor layer in the non-image areas and etching the bared support surface, if desired.

Processes for the preparation of printing forms by electrophotographic means are known, in which a support suited to serve as the printing form is coated with a photoconductor layer which after production of an image by electrostatic charging, exposure, making visible by a toner, and fixing, is removed by dissolving it away in the areas not covered by the toner (DT-OS Nos. 1,522,497; 1,572,312). In these processes, solvents must be used either in the form of purely organic solvents or as aqueous mixtures for dissolving away the photoconductor layer.

As liquid decoating agents give rise to noxious vapors and may be improperly used and removed, they represent an enviornmental hazard. In addition, the automation of such a decoating process requires the use of expensive apparatus.

Further, an imaging process is known (French Pat. No. 1,478,172) in which a carrying sheet is provided with a softenable layer of binding agent containing photoconductor particles, which layer first exhibits a stronger adherence to the carrying sheet than to a receiving sheet to be placed on the carrying sheet. The layer of binding agent is softened or caused to swell by means of an activator so that it can be broken up at a later stage of the process. Upon application of the receiving sheet, an electrostatic field is generated through the binding agent layer and an imagewise exposure is effected through the carrying or receiving sheet which are both transparent. While the electric field is maintained, the carrying and receiving sheet are separated, which results in an imagewise breaking up of the layer of binding agent containing the photoconductor particles. The adherence of the layer of binding agent to the carrying and receiving sheets should differ only slightly; this is best achieved by using the same material for the carrying and receiving sheets. In this manner, a positive and a negative image are obtained.

This process is expensive and does not eliminate the application of harmful solvents as activating components. Also, the direct use of high field-intensities ranging from 39,000 to 98,500 V/mm has proved disadvantageous.

For an improvement of the described process, an imaging process (DT-AS No. 1,802,993) is further known in which a softenable photoconductor layer is placed between a carrying and a receiving sheet; the photoconductor layer is, under the influence of an electric field, softened by an activating agent containing a plastic material which reinforces the broken up softenable photoconductor layer.

However, also in this case high field-intensities and harmful solvent vapors of the activating agent are not eliminated and the relatively complicated and expensive process is not simplified.

It is, therefore, the object of the present invention to provide a simple process for the removal of a photoconductor layer in order to prepare printing forms and/or metallized images, avoiding the use of organic solvents either alone or in mixtures as activating or decoating agents.

This problem is solved by transferring the toner-free photoconductor layer at temperatures between 50° and 250° C. to a receiving material offering a better surface adhesion to the photoconductor layer than the electrically conductive support material.

In a preferred embodiment, the transfer is effected within a temperature range of about 100° to 200° C., depending upon the softening range of the photoconductor layer, which preferably is composed of organic materials. Thus a flawless separation of the image areas and non-image areas of the photoconductor layer is achieved.

For this purpose it is necessary only to choose a receiving material to whose surface the photoconductor layer adheres better than to the support material.

Further, the toner applied for developing the image must have a lower adhesion, or no adhesion at all, relative to the receiving material in order to avoid transferring the image areas to the receiving material.

Compounds with softening or melting points considerably higher than the softening range of the photoconductor layer and compounds exhibiting adhesive properties are particularly suited as toner substances.

When performing the process, the receiving material is placed on the photoconductor layer treated with the toner, and the layer and the receiving material are pressed together by passing them between a pair of rollers, one of which is heated. Then, the support carrying the photoconductor layer and the receiving material are separated. In this manner the photoconductor layer in the non-image areas is lifted off its support material and strongly adheres to the receiving material, while the areas of the photoconductor layer covered with the toner remain on the support material. Transfer under pressure, preferably under a pressure of about 10 atmospheres is particularly advantageous.

If a metal surface suited for printing purposes is used as a support, a printing form can be prepared in this manner. The bared metal surface optionally may be etched to produce printing forms for letter-press or gravure printing. In the case of metallized transparent foils serving as support material for the photoconductor layer, positive transparencies with good masking properties which also may be used as printed circuits will be obtained after removing the metal by etching the non-image areas.

The process according to the present invention will be further illustrated by reference to the accompanying drawings in which FIG. 1 is a schematic representation of one embodiment of the present invention, FIG. 2 shows one step in the developing of the material of FIG. 1, and FIG. 3 shows a further step in the development of the material of FIG. 1.

FIG. 1 shows in a schematic representation the receiving material 3, the electrically conductive support material 2 and the photoconductor layer 1 applied to the support material.

FIG. 2 shows, not to scale, the electrically conductive support material 2 carrying the photoconductor layer 1 covered with the toner 4. The non-image areas are denoted at 6.

FIG. 3 shows the portion 7 of the photoconductor layer which is transferred to the receiving material 3. Optional etchings to be performed after transfer are indicated at 5.

Particularly well-suited support materials 2 for the photoconductor layer 1 are metallized polyester foils, bright-rolled metal foils or metal foils which have been surface-roughened by a mechanical treatment.

The receiving materials 3 for a photoconductor layer 1 applied to the coated metallized polyester foils 1,2 may be bright-rolled, surface-roughened or anodized metal foils 3; a surface-roughened or an anodized foil 3 may be used together with a bright-rolled coated metal foil 1,2, however, the transfer from a surface-roughened coated foil 1,2 to an anodized foil 3 is preferred.

Suitable toner substances 4 are high-melting inorganic materials, such as finely divided metal powders, metal oxides or metal salts, as well as organic materials, such as polyvinyl alcohol or starch. Preferably, polytetrafluoroethylene is used as the toner substance.

The following examples further illustrate the invention:

EXAMPLE 1

A solution of 17.0 g of 2,5-bis-(4'-diethylaminophenyl)-1,3,4-oxadiazole, 17.0 g of a copolymer of styrene and maleic anhydride and 0.34 g of Rhodamine B extra in 250 g of glycol monomethyl ether, 62 g of butyl acetate, 54 g of butanone and 34 g of methanol is applied to a polyester foil which is 75$\mu$ thick and metallized with 1$\mu$ of aluminum in order to obtain a photoconductor layer of 4$\mu$ thickness of the aluminum after the solvent has evaporated. The layer is positively charged to 400 V in the dark by means of a corona and exposed using an original. If the original is exposed in contact, the exposure time is 5 seconds using a 100 W light bulb at a distance of 65 cm.

Following the exposure, the resulting latent charge image is developed with a liquid toner obtained by finely dispersing 3 g of polytetrafluoroethylene in a solution of 4 g of pentaerythritol resin ester in 200 ml of an isoparaffin with a boiling range between 185° and 210° and diluting the mixture with 2 l of an isoparaffin with a boiling range between 185° and 210°. Upon removal of the excess developing liquid and drying of the toner image with warm air, the coated polyester foil carrying the toner image is covered by a flexible bright-rolled aluminum foil which is 25$\mu$ thick and both are passed between a pair of rollers at a speed of 0.5 m/min.

The pair of rollers is composed of a steel roller heated up to 120° C. and a counter-roller coated with polytetrafluoroethylene. Particularly advantageous results are achieved when the covering aluminum foil faces the heated steel roller and the pressure exerted by the pair of rollers is about 10 atmospheres gauge. After the foil material has cooled down to room temperature, the aluminum foil is pulled off of the polyester foil. The photoconductor layer covered with toner remains on the polyester foil, while the photoconductor layer in the non-image areas adheres to the aluminum foil. The polyester foil now represents a planographic printing form, on which the image areas composed of the toner-covered photoconductor layer are oleophilic and the aluminum surface bared in the non-image areas is hydrophilic. The foil can be used for printing in the usual way when it is mounted in an offset printing machine.

EXAMPLE 2

A polyester foil which is 100$\mu$ thick and metallized with 2$\mu$ of aluminum on one side is coated with a solution of 10 g of 2-vinyl-4-(2'-chlorophenyl)-5-(4''-diethylaminophenyl)-oxazole, 10 g of a copolymer of styrene and maleic anhydride and 0.05 g of Rhodamine B in 135 g of tetrahydrofuran in order to obtain a photoconductor layer of 5$\mu$ thickness on the aluminum surface. By means of a corona, the layer is negatively charged to 500 V in the dark, then exposed in the manner described in Example 1 and developed with a liquid toner which is obtained by finely dispersing 3 g of zinc oxide in a solution of 4 g of a hydrogenated pentaerythritol resin ester in 200 ml of an isoparaffin with a boiling range between 185° and 210° and diluting the mixture with 4 l of the same isoparaffin. The developed polyester foil coated with the photoconductor is processed as described in Example 1 to a printing form. The areas of the photoconductor layer which are covered by zinc oxide are not affected by the influence of the heat and are the oleophilic areas of a planographic printing form which may be used for printing in known manner.

If the image-carrying foil thus obtained is treated with 2 N soda lye, which requires about 2 minutes at 22° C., the aluminum layer uncovered in the non-image areas is dissolved. Depending upon the original used for exposure, a well-covering positive transparency or a printed circuit can be prepared in this manner.

The photoconductor layer also can be removed with a solvent such as tetrahydrofuran in order to obtain a metallized image on a transparent base.

EXAMPLE 3

The procedure is as described in Example 1, however, the photoconductor layer is negatively charged to 450 V and instead of a liquid developer a dry toner is used to develop the latent charge image on the photoconductor layer. The dry toner is composed of precipitated calcium carbonate applied by means of a magnetic brush. The developer mixture required is composed of 2 g of calcium carbonate and 100 g of iron powder of a particle size of 75 to 150 $\mu$m. A printing form is prepared as described above.

EXAMPLE 4

The procedure is as described in Example 1, but instead of the polyester foil metallized with aluminum, a bright-rolled aluminum foil is used which is 100$\mu$ thick. After developing with polytetrafluoroethylene in accordance with Example 1, a mechanically surface-roughened aluminum foil of 100$\mu$ thickness is placed on the photoconductor layer and the material is passed between a pair of rollers at a speed of 0.2 m/min. The steel roller of the pair is heated to a temperature of 150° C. and a pressure of about 10 atmospheres is exerted between the two rollers. In the areas not covered by polytetrafluoroethylene, the photoconductor layer is transferred to the mechanically surface-roughened aluminum. Both aluminum foils exhibit an imagewise distribution of the photoconductor layer and may be used as offset printing forms.

EXAMPLE 5

The photoconductor solution described in Example 2 is applied to a mechanically surface-roughened aluminum foil of about 100$\mu$ thickness. Following evaporation of the solvent, the photoconductor layer which is about 5μ thick is positively charged to 400 V by means of a corona and episcopically exposed in a reproduction camera. Using eight 500 W lamps and a diaphragm setting of 11, the exposure time is twenty seconds. The resulting charge image is developed with the liquid toner of polytetrafluoroethylene described in Example 1. Then, the procedure described in Example 4 is followed with the difference that an anodized aluminum foil is used as the receiving material for the photoconductor layer.

It will be obvious to those skilled in the art that many modifications may be made within the scope of the present invention without departing from the spirit thereof, and the invention includes all such modifications.

What is claimed is:

1. In the process for the preparation of printing forms and/or metalized images by electrostatic charging, exposing, and treating with a toner of a photoconductor layer applied to an electrically conductive support material, and removing the photoconductor layer in the non-image areas, said toner having no adhesive properties or only slight adhesive properties relative to a receiving material, the improvement which comprises effecting removal of the toner-free photoconductor layer only by transferring it, under pressure, in the absence of a solvent and at a temperature in the range of about 50° to 250° C. to a receiving material which has a greater surface adhesion to the photoconductor layer than does the electrically conductive support material.

2. A process according to claim 1 including transferring the photoconductor layer at a temperature in the range of about 100° to 200° C.

3. A process according to claim 1 including transferring the photoconductor layer under a pressure of about 10 atmospheres gauge.

4. A process according to claim 1 including transferring the toner-free photoconductor layer from a mechanically surface-roughened aluminum foil to an anodized aluminum surface.

5. A process according to claim 1 including treating the latent image on the photoconductor layer with a liquid developer containing polytetrafluoroethylene as the toner.

6. A process according to claim 1 including etching the non-image areas of the support material.

* * * * *